US010555449B2

(12) United States Patent
Hwang et al.

(10) Patent No.: US 10,555,449 B2
(45) Date of Patent: Feb. 4, 2020

(54) APPARATUS FOR AUTOMATICALLY SUPPLYING CARRIER TAPE COMPRISING DEVICE FOR AUTOMATICALLY EXPOSING PARTS (71) Applicant: Young Soo Hwang, Gyeonggi-do (KR)

(72) Inventors: Young Soo Hwang, Gyeonggi-do (KR); Bong Hee Jung, Gyeonggi-do (KR); Su Hong Park, Gyeonggi-do (KR)

(*) Notice: Subject to any disclaimer, the term of this patent is extended or adjusted under 35 U.S.C. 154(b) by 1194 days.

(21) Appl. No.: 14/425,321

(22) PCT Filed: Aug. 8, 2013

(86) PCT No.: PCT/KR2013/007152
§ 371 (c)(1),
(2) Date: Sep. 1, 2015

(87) PCT Pub. No.: WO2014/035075
PCT Pub. Date: Mar. 6, 2014

(65) Prior Publication Data
US 2015/0382523 A1 Dec. 31, 2015

(30) Foreign Application Priority Data

Aug. 31, 2012 (KR) .................. 10-2012-0096018
Feb. 13, 2013 (KR) .................. 10-2013-0015442
May 24, 2013 (KR) .................. 10-2013-0058796

(51) Int. Cl.
H05K 13/04 (2006.01)
B65H 37/00 (2006.01)

(52) U.S. Cl.
CPC ....... *H05K 13/0417* (2013.01); *B65H 37/002* (2013.01)

(58) Field of Classification Search
CPC ........... H05K 13/0417; H05K 13/0419; B65H 37/002
See application file for complete search history.

(56) References Cited

U.S. PATENT DOCUMENTS 8,678,065 B2* 3/2014 Hwang .............. H05K 13/0215
156/764
9,592,986 B2* 3/2017 Kitani .................... B65H 20/20
(Continued)

FOREIGN PATENT DOCUMENTS

KR 2005-0045862 A 5/2005
WO 2005/046302 A1 5/2005

*Primary Examiner* — William E Dondero
(74) *Attorney, Agent, or Firm* — Sarika Singh; William Hare; McNeely, Hare & War LLP (57) ABSTRACT Disclosed is an apparatus for automatically supplying carrier tape, and more specifically, to an apparatus for automatically supplying a carrier tape and a method for automatically supplying carrier tape wherein carrier tape is enabled to be continuously and automatically supplied without stopping a process even if a structure or supply conditions of the carrier tape is changed. The apparatus for automatically supplying the carrier tape comprises an injection module comprising a height adjusting unit for enabling the continuous and automatic supply of one carrier tape in the middle of being supplied and one or more carrier tapes on standby, and a parts sensor for sensing parts of a carrier tape; and a pickup module for separating a cover tape form the carrier tape transferred from the injection module.

2 Claims, 9 Drawing Sheets (56) References Cited

U.S. PATENT DOCUMENTS

| | | | |
|---|---|---|---|
| 9,839,170 B2 * | 12/2017 | Murase | H05K 13/02 |
| 9,914,609 B2 * | 3/2018 | Ohashi | B65H 20/22 |
| 9,957,126 B2 * | 5/2018 | Ohashi | H05K 13/0084 |
| 2011/0243695 A1 * | 10/2011 | Hwang | H05K 13/0215 |
| | | | 414/412 |
| 2015/0195964 A1 * | 7/2015 | Yamasaki | H05K 13/0419 |
| | | | 226/76 |
| 2015/0223373 A1 * | 8/2015 | Yamasaki | H05K 13/0417 |
| | | | 226/76 |

* cited by examiner

APPARATUS FOR AUTOMATICALLY SUPPLYING CARRIER TAPE COMPRISING DEVICE FOR AUTOMATICALLY EXPOSING PARTS

CROSS-REFERENCE TO RELATED APPLICATIONS

This application is a National Phase Application under 35 USC 371 of PCT/KR2013/007152, filed Aug. 8, 2013 (published as WO 2014/035075), which claims priority to Korean Application Nos. KR20120096018, filed Aug. 31, 2012, KR20130015442, filed Feb. 13, 2013, and KR20130058796, filed May 24, 2013. The disclosure of the prior applications are considered part of and are incorporated by reference in their entirety in the disclosure of this application.

BACKGROUND OF THE INVENTION

1. Field of the Invention

Apparatuses and methods consistent with the exemplary embodiments relate to an apparatus for automatically supplying a carrier tape, and more specifically, to an apparatus for automatically supplying a carrier tape wherein the carrier tape is enabled to be continuously and automatically supplied without stopping a process even if a structure or supply conditions of the carrier tape is changed.

2. Description of the Related Art

An apparatus for picking up and mounting a plurality of electronic parts on a specific position of a printed circuit board (PCB) is called a surface mounting device (SMD). From the SMD to the PCB, parts may be supplied by tape roll, tray and stick. In the apparatus for supplying electronic parts by a tape roll, a carrier tape is used as a member for supplying such electronic parts.

In general, a tape feeder or a tape supplying apparatus for supplying a carrier tape may include a tape transferring unit for transferring the carrier tape accommodating parts therein to a pickup position; and a collecting/discharging unit for collecting or discharging a cover tape. Before Prior to being mounting on the SMD, a base tape from which a cover tape has been separated should be positioned in the tape transferring unit of the feeder and the cover tape should be positioned in the collecting/discharging unit. Then, the carrier tape may be transferred to place the parts accommodated in the carrier tape to the pickup position. Various types of apparatuses for automatically supplying a carrier tape have been developed.

Korean Patent Publication No. 2005-0045862 discloses an exposing member and a tape guide for a part mounting device as a related art of the feeder for supplying the carrier tape. More specifically, the related art discloses an exposing member of a tape guide, which enables a part of a cover tape to be separated from a carrier tape by a wedge-shaped tip portion and to be maintained in a folded state while being transferred along a guide surface.

As another related art for the feeder for supplying a carrier tape, WO 2005/046302 discloses a method and an apparatus for exposing electronic parts. The related art specifically discloses an exposing apparatus including a tongue-shaped element and a rounded tip which is provided with a lateral knife-shaped means.

The apparatus disclosed as the related art does not constitute an automatic supplying apparatus that performs the entire operation continuously and accurately depending on the size of parts, or by changing a position of parts in a structural manner or by accurately sensing a pickup position.

The present invention has the following aspects to solve the aforementioned problems of related arts.

SUMMARY OF THE INVENTION

Accordingly, one or more exemplary embodiments provide an apparatus for automatically supplying a carrier tape which automatically and continuously supplies at least one carrier tape by arranging a carrier tape on standby while another carrier tape is being supplied and picked up.

The foregoing and/or other aspects may be achieved by providing an apparatus for automatically supplying a carrier tape that automatically loads and transfers a carrier tape to a pickup position by sensing a position of the carrier tape according to a commencement of an operation of a feeder.

The foregoing and/or other aspects may be achieved by providing a device for automatically exposing parts for an apparatus for supplying a carrier tape that automatically separates from a carrier tape and folds a cover tape.

According to another aspect of the present invention, an apparatus for supplying a carrier tape which enables a supply of at least one carrier tape and a transfer of parts through a single injection path, and enables a continuous and automatic supply of carrier tapes, one of which is being supplied and another one of which is on standby to be supplied following the previously supplied carrier tape.

According to another aspect of the present invention, the apparatus for supplying the carrier tape further comprises a parts sensor for sensing a part from the carrier tape that is being supplied, wherein the parts sensor senses whether a part exists in a rear end portion of the carrier tape to thereby transfer the carrier tape that is being supplies and to transfer another carrier tape on standby.

According to another aspect of the present invention, a device for automatically exposing a part for an apparatus for supplying a carrier tape comprises a base plate which extends in a transfer direction of a carrier tape; a separation unit which has a step against a part of the base plate so that a part of a cover tape is automatically uncovered from an area facing a part of the base plate, wherein the base plate has an extension portion, at least a part of which is narrow in width.

According to another aspect of the present invention, a module for supplying a carrier tape comprises a first cushion unit for closely adhering a carrier tape that has been injected from an injection opening to a transfer path; a second cushion unit which is adjacent to the first cushion unit and transfers a carrier tape from the first cushion unit; and a tape stopper for determining whether to transfer a carrier tape through the second cushion unit depending on the number of the carrier tape, wherein the tape stopper is arranged so that the arrangement may be changed with respect to the transfer path according to a transfer of the carrier tape.

BRIEF DESCRIPTION OF THE DRAWINGS

The above and other aspects, features and advantages of certain exemplary embodiments of the present invention will be more apparent from the following detailed description taken in conjunction with the accompanying drawings, in which.

DETAILED DESCRIPTION OF EXEMPLARY EMBODIMENTS

Exemplary embodiments of the present invention will be described herein below with reference to the accompanying drawings. In the following description, well-known functions or constructions are not described in detail since they would obscure the invention in unnecessary detail. Also, the terms used herein are defined according to the functions of the present invention. Thus, the terms may vary depending on user's or operator's intension and usage. That is, the terms used herein must be understood based on the descriptions made herein.

Figure 1A:
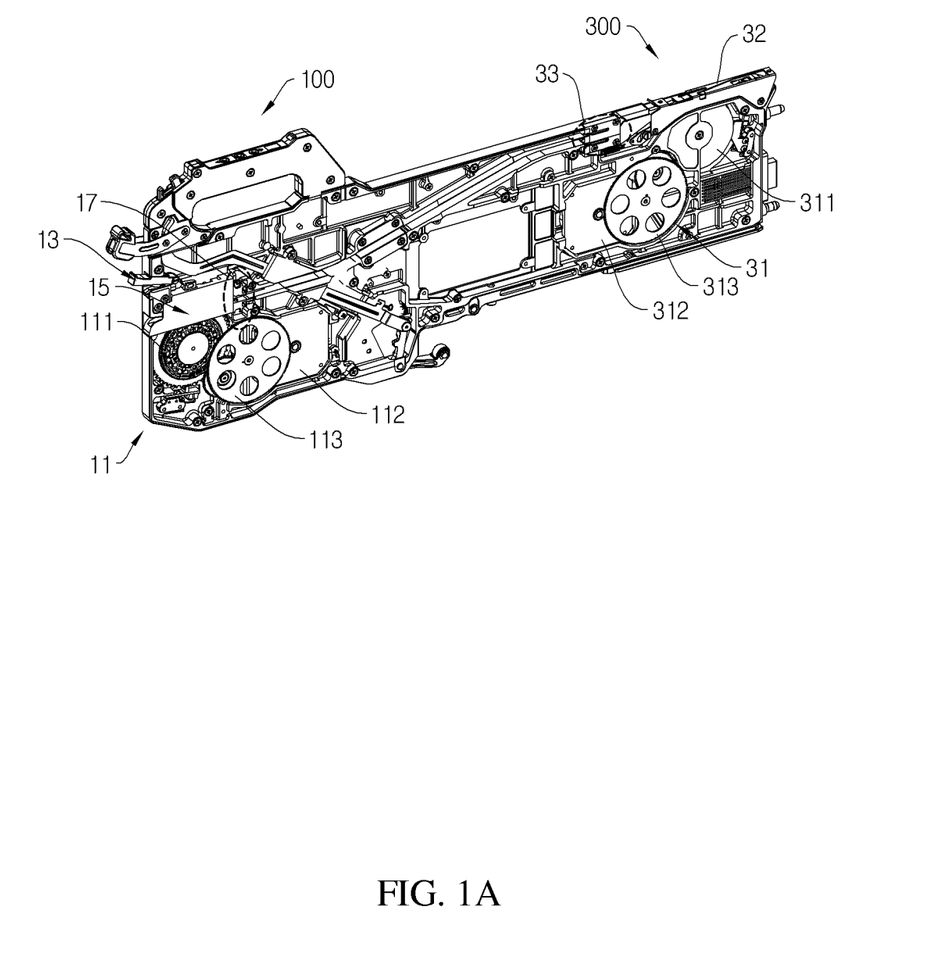
FIG. 1A is a perspective view of an apparatus for supplying a carrier tape according to an embodiment of the present invention.
Figure 1B:
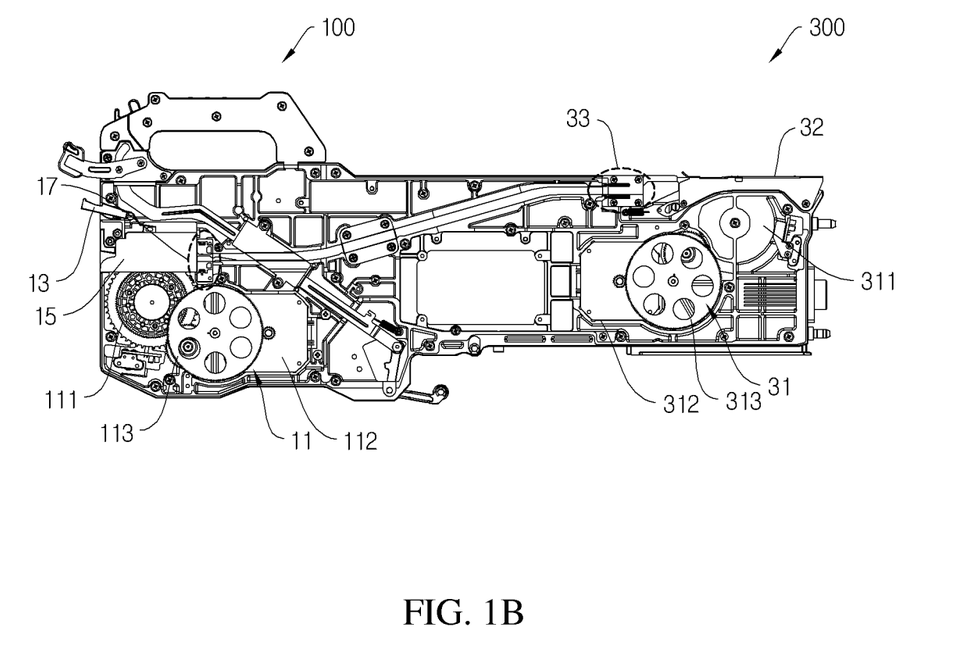
FIG. 1B is a front view of the apparatus for supplying the carrier tape according to the embodiment of the present invention.
Figure 1C:
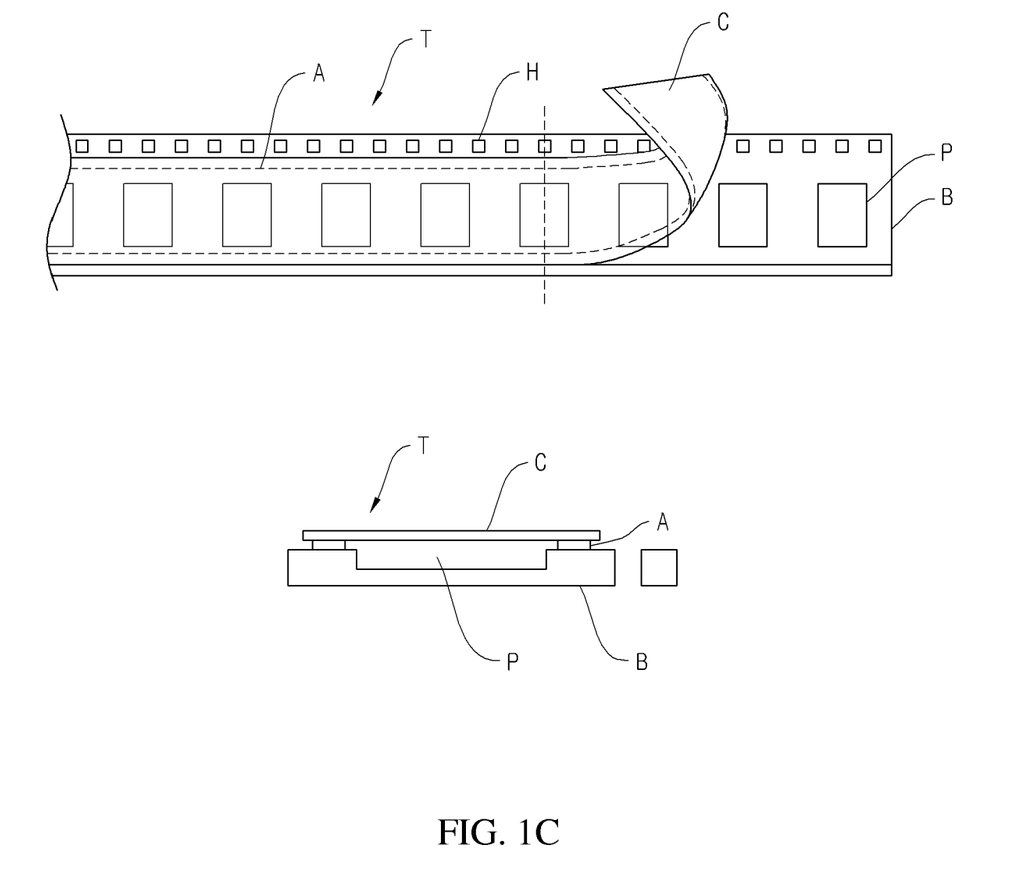
FIG. 1C illustrates a carrier tape that is used for the apparatus for supplying the carrier tape according to the embodiment of the present invention.

FIG. 1A is a perspective view of an apparatus for supplying a carrier tape according to an embodiment of the present invention. FIG. 1B is a front view of the apparatus for supplying the carrier tape according to the embodiment of the present invention. FIG. 1C illustrates a carrier tape that is used for the apparatus for supplying the carrier tape according to the embodiment of the present invention.

Referring to FIGS. 1A and 1B, the apparatus for supplying the carrier tape according to the present invention includes an injection module 100 including a height adjusting unit 15 for supplying at least one carrier tape and transferring parts through a single injection path and for enabling a continuous and automatic supply of one carrier tape T by arranging at least one carrier tape T on standby while another carrier tape is being supplied, and a parts sensor 17 for sensing parts of the carrier tape; and a pickup module 300 for separating a cover tape C from the carrier tape T that is transferred from the injection module 11.

The apparatus for supplying the carrier tape 100 means an apparatus that may transfer an apparatus through an automatic process to supply various parts to be mounted on a PCB. Each of the parts may be supplied in a predetermined order to be mounted on a PCB. The apparatus for supplying the carrier tape 100 according to the present invention enables a continuous and automatic supply of a plurality of carrier tapes through a single injection module to the pickup module.

Referring to FIG. 1C, electronic parts may be accommodated in a pocket P formed in a base tape B and then transferred to the pickup module 300 by the carrier tape T in a sealed form by a cover tape C. Transfer holes H may be formed at a predetermined interval on a lateral side or on opposite lateral sides of the base tape B, and may be coupled to a transferring means such as a sprocket which will be described below to thereby transfer the carrier tape T by a rotation of the sprocket. The cover tape C may be coupled to the base tape B by an adhering area A formed on opposite lateral sides thereof to protect electronic parts accommodated in the pocket P. The cover tape C may be separated in the pickup module 300, and electronic parts may be transferred to and arranged in a predetermined position on a PCB by a pickup means such as an absorbing nozzle. Various types of carrier tapes T may be used depending on the specification of electronic parts, and the present invention is not limited by a particular carrier tape.

Generally, the carrier tape T may be provided to the injection module 100 of the apparatus for supplying the carrier tape 100 by a winding apparatus such a reel.

The injection module 100 may include a first driving unit 11 for driving a transferring means of the carrier tape T; a height adjusting unit 15 for maintaining a carrier tape T on standby while another carrier tape T is being transferred; a vinyl jig 13 for forming a shape so that the cover tape C is easily separated; and a parts sensor 17 for sensing the carrier tape T injected from the winding apparatus to the injection module 100 or electronic parts accommodated in the pocket P of the carrier tape T.

The first driving unit 11 may include a transferring means 111 such as a sprocket to transfer the carrier tape T; a first driving device 112 such as a motor to transmit the driving force to the transferring means 111; and a driving force transferring member 113 that transmits the driving force of the first driving device 112 to the first transferring means 111.

The first driving device 112 may be a shape known in the art, and may be controlled in operation by a controlling device (not shown). The driving force of the first driving device 112 may be transmitted to the transferring means 111 through a driving force transferring member 113 such as a gear or a belt. The carrier tape T may be transferred to the pickup module 300 at a predetermined speed by the transferring means 111 through the transferring guide from the injection module 100.

According to the present invention, the vinyl jig 13 and the height adjusting unit may form an injection standby unit. The injection standby unit may maintain the carrier tape T that has been injected to the injection module 100 for transfer, may enable a coupling with the transferring means 111 during the injection and transferring processes of the carrier tape T, and at the same time, may fix the carrier tape T to a predetermined position while in standby.

The parts sensor 17 may sense whether an electronic part is accommodated in the pocket P of the carrier tape T. The parts sensor 17 may include, for example, a light sensor, but not limited thereto. The parts sensor 17 may be installed in front of or behind the injection standby unit.

Generally, no part exists in a rear end of the carrier tape T that is being supplied. If the carrier tape T is continuously supplied, a rear end portion of the carrier tape T that is firstly supplied passes through the parts sensor 17, and then a front portion of a new carrier tape T is supplied. In this case, the parts sensor 17 senses a starting position of a vacant part and the number of the vacant part and transmits the sensing information to a controlling device. Based on the length of the vacant rear end portion of the carrier tape T that has been sensed by the parts sensor 17, an operation of the second driver 311 of the pickup module 200 may be controlled.

If the rear end portion of the carrier tape T that is being supplied to the pickup module 300 arrives in a pickup position, the first driving unit 111 temporarily suspends its operation, and the transfer of a new carrier tape T is suspended as well. Then, the second driving unit 311 is continuously operated to discharge the carrier tape T in which the pocket P does not accommodate a part, from the pickup position. The second driving unit 311 operates as long as the length of the carrier tape that is vacant as sensed by the parts sensor 17. If a carrier tape that is longer than the distance between the parts sensor 7 and the pickup position or a new carrier tape is not supplied to the rear end portion of the carrier tape T, an operation of discharging the vacant carrier tape may not be performed.

If the vacant carrier tape T is discharged from the pickup module 300, the first driving unit 111 operates again and transfers a new carrier tape T.

The parts sensor 17 may sense an electronic part and transmit the information to a controlling device (not shown). The first transferring means 112 rotates by the driving of the first driving device 112 and may transfer the carrier tape T to the pickup module 300.

The carrier tape T may be transferred from the injection module 100 to the pickup module 300. As necessary, a guide may be installed between the injection module 100 and the pickup module 300 to guide the transfer of the carrier tape T. The guide may be shaped to make a lower surface of the carrier tape T closely adhered to the transfer surface. The guide may be included in the injection module 100 or the pickup module 300. More specifically, the guide may be formed in an end portion of the injection module 100 or in a front portion of the pickup module 300. The guide may be shaped to transfer the carrier tape T from the injection module 100 to the pickup module 300, and the present invention is not limited by the structure of the guide provided herein.

The pickup module 300 may include a second driving unit 31 including a transferring means such as a sprocket; a tape sensor unit 33 for sensing the structure of the carrier tape T; and a tape guide 32 that separates a side of the cover tape C from the base tape B so that the cover tape C is folded to expose an electronic part accommodated in the pocket P.

The second driving unit 31 transmits the driving force from the second driving device 312 to the second transferring means 311 through the driving force transferring means 313 to transfer the carrier tape T in a predetermined direction.

In the embodiment, the first driving unit 111 and the second driving unit 311 are formed in the injection module 100 and the pickup module 300, respectively, and are operated by independent driving means 112 and 312, respectively. Alternatively, the first and second driving units 112 and 312 may be operated by a single driving means. Further, the first and second driving units 112 and 312 may have an identical or different driving means. The respective driving means may be driving means known in the art including a motor, and the present invention is not limited to the embodiment provided herein.

The transfer distance of the carrier tape T from the pickup module 300 may be sensed by a tape sensor unit 33. More specifically, the tape sensor unit 33 senses a transfer hole H formed in the carrier tape T or the pocket P to thereby sense whether the carrier tape T has been transferred by the predetermined distance. Based on the sensing result, the pocket P of the carrier tape T may be transferred to a predetermined position and an electronic part may be finely controlled and transferred to a pickup position.

The cover tape C may be separated from the base tape B in a predetermined form by the tape guide 32. The cover tape C is separated from the base tape B by the tape guide 32 and then is folded in a predetermined shape. Then, an electronic part accommodated in the pocket P is picked up by, e.g., a device such as an absorbing nozzle and transferred to a predetermined position in a PCB.

If an electronic part is picked up and the carrier tape T is transferred by the second transferring means 311, the base tape B and the cover tape C are completely separated from each other and may be discharged through predetermined discharging paths, respectively. More specifically, the cover tape C may be discharged toward the injection module 100 by a cover tape discharging module while the base tape B may be discharged toward a rear portion of the pickup module 12. The cover tape C or the base tape B may be discharged in a manner known in the art, and the present invention is not limited thereto.

Below, apparatuses installed in modules will be described.

Figure 2A:
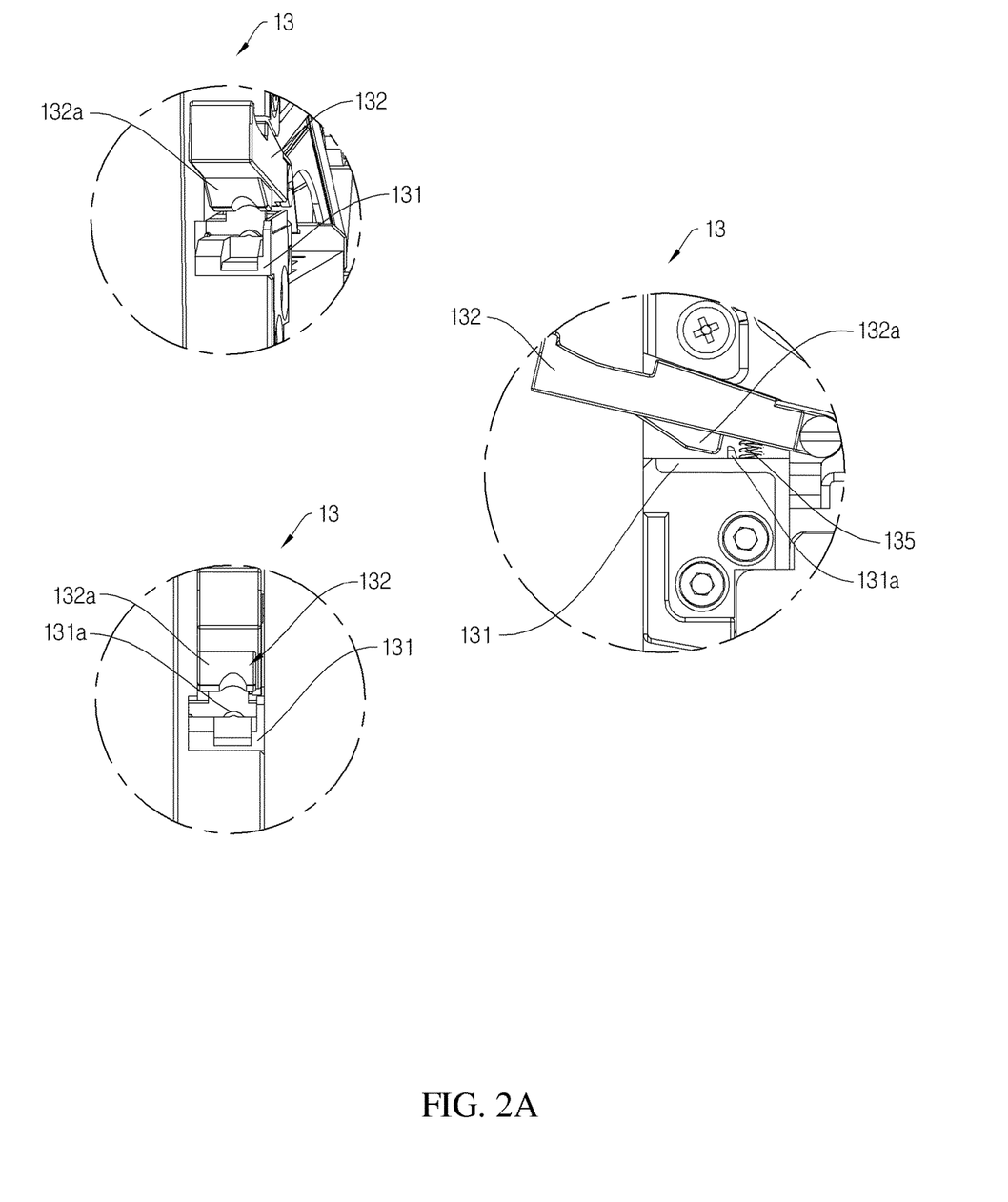
FIG. 2A illustrates a vinyl jig that is used for an apparatus for automatically supplying a carrier tape according to the embodiment of the present invention.

FIG. 2A illustrates a vinyl jig according to an embodiment of the present invention.

The vinyl jig 13 maintains the carrier tape T supplied by a winding device such as a reel, in a predetermined position while a transferring process is not performed, and at the same time forms the shape of the carrier tape T to make the cover tape C easily separated from the base tape B.

Referring to FIG. 2A, the vinyl jig 13 may include a bottom fixing member 131 and a top shaping member 132 that continuously makes a consistent shape of the carrier tape T and has an end part coupled to the bottom fixing member 131 to move upward and downward with respect to an elastic member 135.

The bottom fixing member 131 supports the carrier tape T on standby or in transfer, and the top shaping member 132 applies a consistent pressure on the carrier tape T to make all or a part of the carrier tape T have a hemispherical shape. As shown in FIG. 2A, a shaping projection 131a may be formed in a central portion of the bottom fixing member 131 in a width direction, and the top shaping member 132 may include an extension projection 132a. The shaping projection 131a may be ahead of the extension projection 132a (in a direction in which the pickup module 300 is positioned) and may have a semicircular shape. The extension projection 12a is inclined downward from a rear side (in a direction of the winding device) and may have a groove in a central portion thereof whose cross section is semicircular. Front portions of the bottom fixing member 11 and the top shaping member 132 are coupled to each other so that the top shaping member 132 may be inclined as a whole with respect to the bottom fixing member 131. Further, the front portions of the bottom fixing member 11 and the top shaping member 132 may form a space that may be adjusted by the elastic member 135 to allow the carrier tape T to pass there-through.

When passing through the vinyl jig 13, a central portion of the carrier tape T may become convex by a groove formed in the shaping projection 131a and the extension projection 132a. The foregoing shape allows the cover tape C to be easily separated from the base tap B in the tape guide 32 of the pickup module 300.

Various structures of the vinyl jig 13 may apply to the apparatus for supplying the carrier tape according to the present invention to enable the cover tape C to be easily separated from the base tape B and the present invention is not limited to the embodiment provided herein.

Figure 2B:
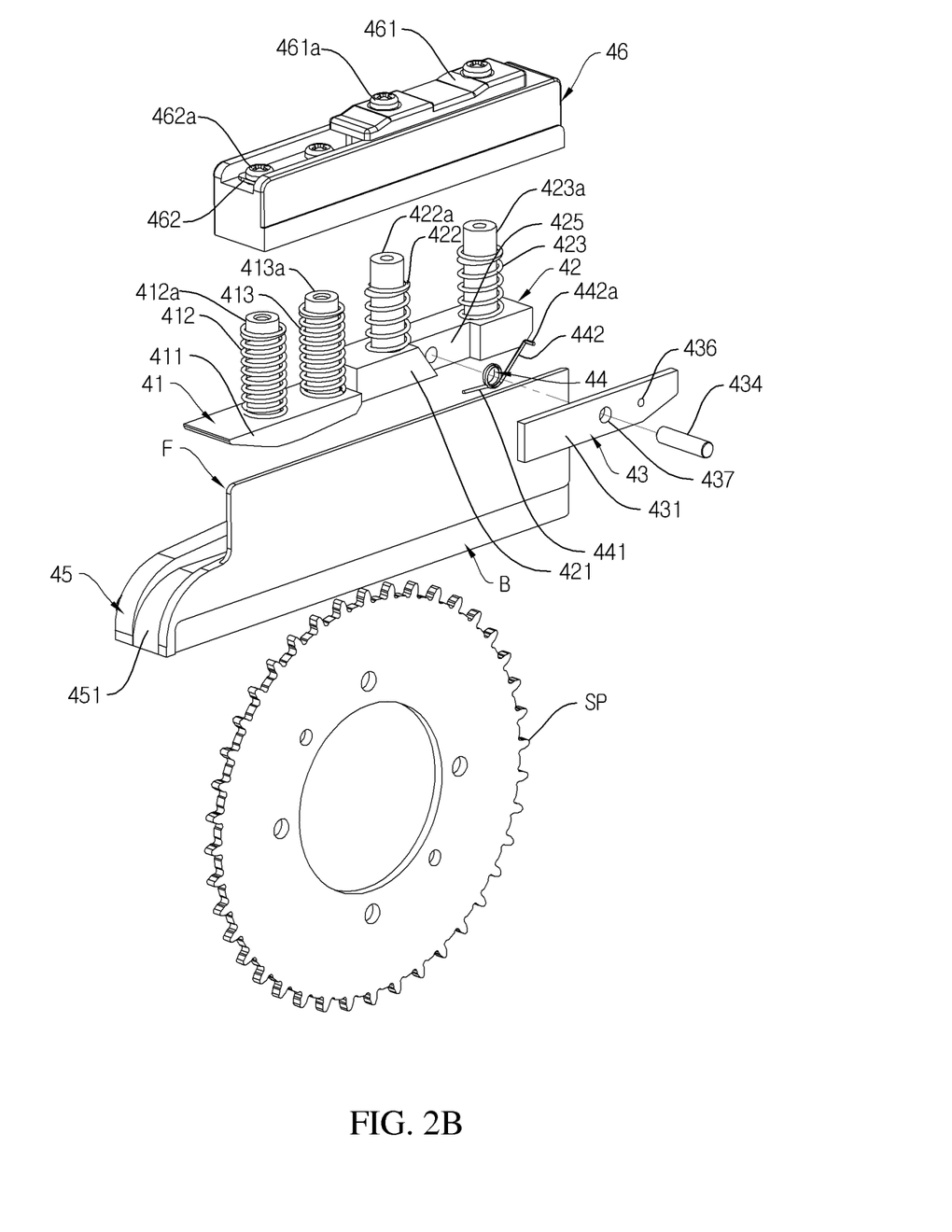
FIG. 2B illustrates a supplying module that is used for the apparatus for automatically supplying the carrier tape according to the embodiment of the present invention.

FIG. 2B illustrates a supplying module that is used for an apparatus for automatically supplying a carrier tape according to another embodiment of the present invention.

Figure 2C:
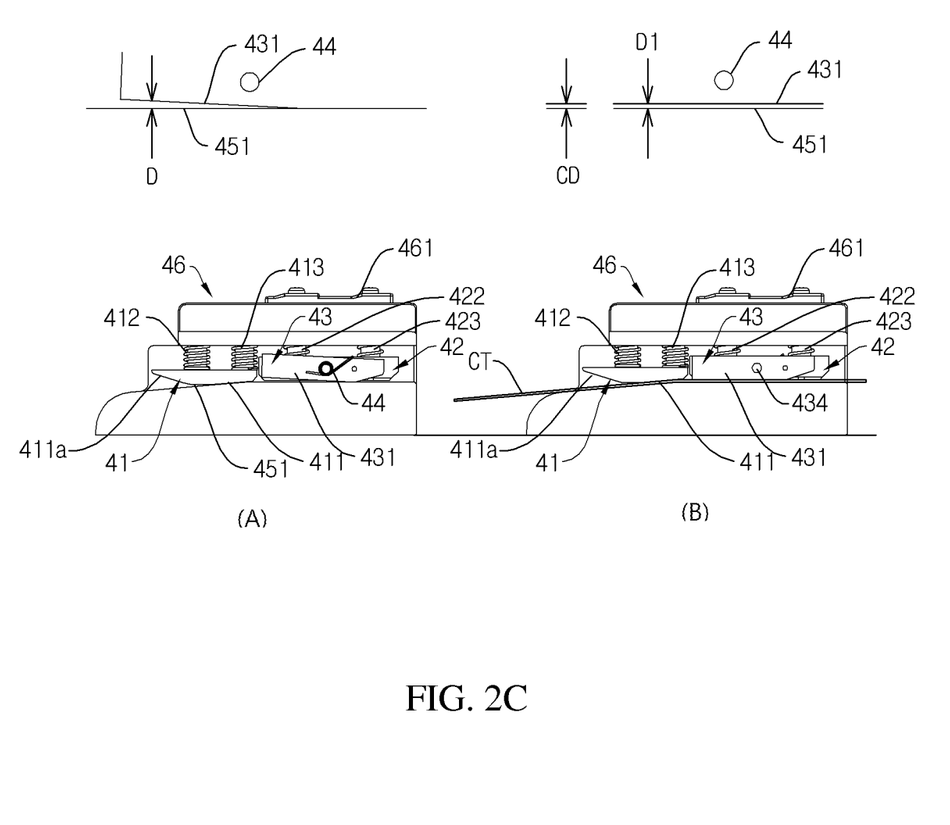
FIGS. 2C and 2D respectively illustrate a process of transferring a carrier tape through the supplying module in FIG. 2B and a process of sequentially supplying and transferring two carrier tapes according to an embodiment of the present invention.
Figure 2D:
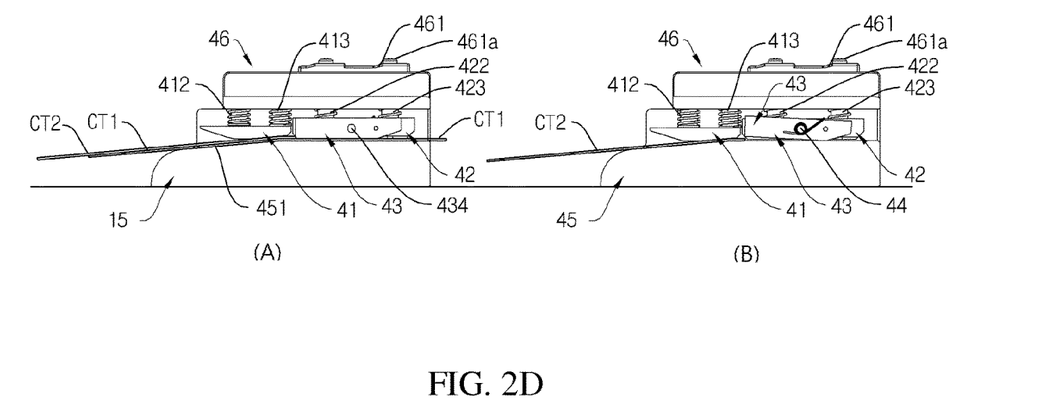

FIGS. 2C and 2D respectively illustrate a process of transferring a carrier tape through the supplying module in FIG. 2B and a process of sequentially supplying and transferring two carrier tapes according to an embodiment of the present invention.

Referring to FIG. 2B, a module for supplying a carrier tape includes a first cushion unit 4 that enables a carrier tape that has been injected from an injection opening 15 to be closely adhered to a transfer path 451; a second cushion unit 2 that is arranged adjacently to the first cushion unit 41 and transfers the carrier tape from the first cushion unit 41; and a tape stopper 43 that determines whether to transfer the carrier tape through the second cushion unit 42 depending on the number of the carrier tape. The tape stopper 43 may be changed in arrangement with respect to the transfer path 451 depending on the position of the second cushion unit 42.

The carrier tape T may be injected to the supplying module through the injection opening 45. The carrier taper T may be automatically or manually supplied to the injection opening 45 from a device such as a reel. The injection opening 45 is provided as a single unit as will be described below, but not limited thereto. The injection opening 45 may be provided in a plurality, and at least one of a plurality of injection openings 45 may be connected to the supplying module which will be described below. The injection opening 45 may have a structure known in the art, and the present invention is not limited by the structure of the injection opening 45.

The carrier tape T which has been injected through the injection opening 45 may accommodate an electronic part therein, and the electronic part may be sensed by a device such as a parts sensor. The carrier tape T which has been injected from the injection opening 45 may be transferred by a device such as a sprocket SP through the transfer path 415 to the first cushion unit 41. The transfer path 151 may form a guide surface in opposite sides of which walls are formed, but not limited thereto, and may have a proper shape for transferring a carrier tape.

The first cushion unit 41 may include a cushion body 411 for closely adhering a carrier tape to the path, and at least one of transfer limiting units 412 and 413 that are installed on the cushion body 411. The transfer limiting units 412 and 413 may include a coil spring that is supported by, e.g., fixing bosses 412a and 413a, but not limited thereto. The first cushion unit 41 may be coupled to a transfer plate 462 that is coupled to an upper frame 46 by the fixing bosses 412a and 413a. As shown in FIG. 2B, the first cushion unit 41 may be coupled to the transfer plate 462 by a fixing bolt 462a coupled to the fixing bosses 412a and 413a, and the transfer plate 462 may be installed to move upward and downward. The transfer limiting units 412 and 413 may limit a transfer of a carrier tape above the transfer plate 461 or restore the carrier tape.

The carrier tape that has been transferred by the first cushion unit 41 may be supplied to the second cushion unit 42. The second cushion unit 42 may be adjacent to the first cushion unit 41, and may include an extension body 421 that has a bottom surface extending by facing the transfer path 451 of the carrier tape as a whole, and an inclined discharging surface that is formed in a rear end portion of the extension body 421.

The carrier tape that has been injected through the injection opening 45 may remain closely adhered to the transfer path 451 by the first cushion unit 41. The carrier tape may be transferred by the sprocket SP and then closely adhered to the transfer path 451 by the extension body 421 of the second cushion unit 42, and then transferred to a pickup position (not shown) along a proper transfer path or by a transfer means.

The tape stopper 43 may be shaped like a plate, and may be installed to adjust an inclination of the extension body 421. The inclination of the tape stopper 43 may be adjusted by a position adjusting connector 44 that is coupled to the second cushion unit 42.

An installation groove 425 and the position adjusting connector 44 may be provided in the body 421 of the second cushion unit 42. The position adjusting connector 44 may include a supporting portion 441 that extends in a side centering on a fixing hole, an extension portion 442 that is extended in another side, and a coupling portion 442a that is formed in an end portion of the extension portion 442. The position adjusting connector 44 may be made by a material that may be elastically deformed, and may be coupled to the second cushion unit 42 in a rotatable structure and the tape stopper 43 by a rotation fixing pin 434. More specifically, the rotation fixing pin 434 may be coupled to a fixing hole 437, a fixing hole of the position adjusting connector 44 and a fixing hole formed in the installation groove 125, and accordingly, the position adjusting connector 44 may be fixed to the installation groove 425 to rate the extension portion 442.

The transfer adjusting units 422 and 423 may include a coil spring that is supported by fixing bosses 422a and 423a formed in the cushion body 421. The fixing bosses 422a and 423a may be means that couple the cushion body 421 to the transfer plate 461 through a fixing bolt 461a. The cushion body 421 may be spaced from the transfer path 451 to enable the carrier tape to be supplied without difficulty. If the carrier tape moves to a lower side of the cushion body 421, the cushion body 421 moves upward and the space between the cushion body 421 and the transfer path 451 is wider. The cushion body 421 may move upward together with the transfer plate 131, and applies a pressure downward or toward the carrier tape by the transfer adjusting units 422 and 423. Therefore, the carrier tape may be transferred along the transfer path 451 by being closing adhered thereto. As described above, if the cushion body 421 moves upward, the tape stopper 43 rotates and the arrangement may be changed. If the carrier tape passes through the cushion body 421, the cushion body 421 moves downward by the restoring force of the transfer adjusting units 422 and 423.

Referring to (A) in FIG. 2C, before a carrier tape CT is transferred, the tape stopper 43 may be arranged to be inclined on the basis of the transfer path 451. More specifically, the tape stopper 43 may be arranged so that a front portion of the extension body 431 moves upward with respect to the transfer path 451 and a rear portion of the extension body 431 contacts the transfer path 451. The second cushion unit 42 may be arranged in parallel with the tape stopper 43, and may be coupled by the position adjusting connector 44. The second cushion unit 42 projects toward the first cushion unit 41 compared to the tape stopper 43. Due to the foregoing structure, the carrier tape CT firstly contacts a front portion of the cushion body 421 of the second cushion unit 42 and then contacts a front portion of the extension body 131.

A top portion in FIG. 2C illustrates a correlative position of the transfer path 451 and a lower surface of the extension body 431. A separation distance D that is formed in a front portion of the extension body 131 may be determined by the thickness of the carrier tape. More specifically, if the extension body 431 rotates by the position adjusting connector 14 and is in parallel with the injection path 451 or the transfer path, the separation distance D may be determined to correspond to the thickness of the carrier tape CT.

Referring to (B) in FIG. 2C, if the carrier tape CT is transferred through the supplying module, the first cushion unit 41 pushes the transfer limiting means 412 and 413 upward and the carrier tape CT may be transferred by being closely adhered to the transfer path by the elastic force of the transfer limiting units 412 and 413. While the carrier tape CT passes through the second cushion unit 42 and the tape stopper 43, the second cushion unit 42 is pushed upward and the arrangement of the tape stopper 43 is changed. Then, the position adjusting connector 44 rotates.

As shown in a top portion of (B) in FIG. 2C, a lower surface of the extension body 431 is substantially in parallel with the transfer path 451. That is, the arrangement of the tape stopper 43 is changed. In such state, a space D1 between the lower surface of the extension body 431 and the transfer path is similar to the thickness CD of the carrier tape CT. More specifically, the space D1 may be larger than the thickness of the carrier tape CD, and as will be described below, may be smaller than the thickness of the two overlapping carrier tapes CD.

FIG. 2D illustrates a process of injecting and sequentially transferring two carrier tapes CT1 and CT2 through a supplying module according another embodiment of the present invention.

Referring to (A) in FIG. 2D, while a carrier tape CT1 is transferred, another carrier tape CT2 may be injected. Since the carrier tape CT1 is being transferred, the tape stopper 42 may be in parallel with the transfer path 451. If another carrier tape CT2 is injected, the first cushion unit 41 pushes the transfer limiting units 412 and 413 upward, and then the injected carrier tape CT2 passes through the first cushion unit 11 to be positioned in front of the tape stopper 43. As described above, the tape stopper 43 may project forward compared to the second cushion unit 42, and may include an inclined entrance. This enables the carrier tape CT2 to be transferred as much as the projected portion of the tape stopper 43. However, if the previous carrier tape CT1 is passing through the second cushion unit 42, the tape stopper 13 is arranged to be in parallel with the transfer path, and is separated from the transfer path as far as a distance that is equivalent to the thickness of the carrier tape CT1. Then, the new carrier tape CT2 is prevented from being transferred and is on standby due to the parallel arrangement of the tape stopper 43 and the front surface structure.

The carrier tape CT2 on standby should be fixed to or maintained in a predetermined position to be transferred immediately after the carrier tape CT1 passes through the second cushion unit 42. The first cushion unit 41 may have a function of maintaining the carrier tape CT2 that is on standby, in a predetermined position. More specifically, the first cushion unit 41 may apply a pressure on the carrier tape CT2 through the transfer limiting units 112 and 113, and thus the carrier tape CT2 may be maintained on standby without difficulty.

Referring to (B) in FIG. 2D, if the carrier tape CT1 completely passes through the second cushion unit 42, the second cushion unit 42 moves downward by the restoring force of the transfer adjusting units 422 and 423, and the tape stopper 43 may be inclined again by the restoring force of the position controlling connector 44. More specifically, a front portion of the tape stopper 43 moves upward and a rear portion thereof contacts the transfer path 451. Then, the carrier tape CT2 may move toward a lower surface of the second cushion unit 42 by a rotation of a sprocket. The second cushion unit 42 may then move upward again, and the arrangement of the tape stopper 13 may be changed, and the position controlling connector 44 rotates. If the carrier tape CT2 passes through the second cushion unit 42 and the tape stopper 43, the second cushion unit 42 and the tape stopper 43 return to their initial state by the restoring force of the transfer adjusting units 422 and 423 and the position adjusting connector 44, and a new carrier tape may be transferred.

FIG. 2D illustrates an automatic and continuous supply of two carrier tapes CT1 and CT2 according to an embodiment of the present invention, but a plurality of carrier tapes CT1 and CT2 may be automatically and continuously supplied by a supplying module according to the present invention.

Figure 3A:
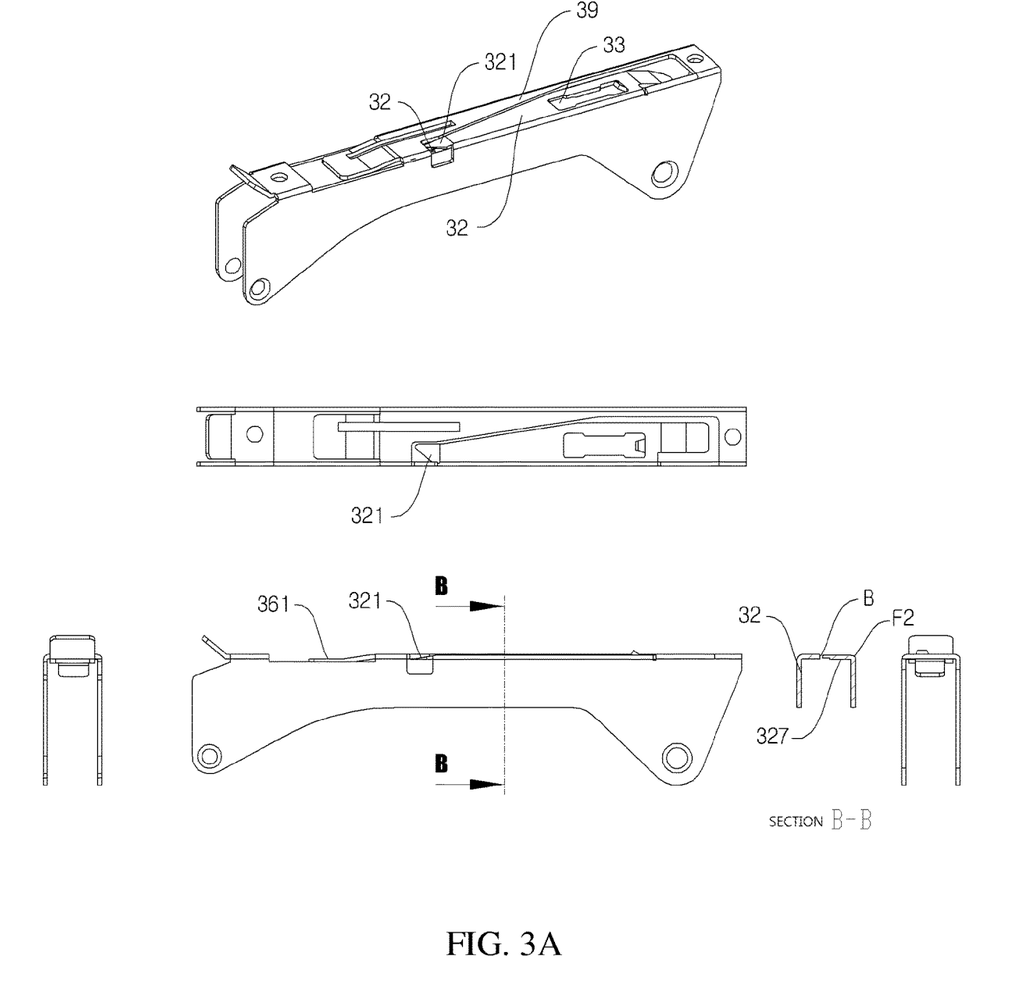
FIGS. 3A, 3B and 3C illustrate a device for automatically exposing parts that may be used for the apparatus for automatically supplying the carrier tape according to the embodiment of the present invention.
Figure 3B:
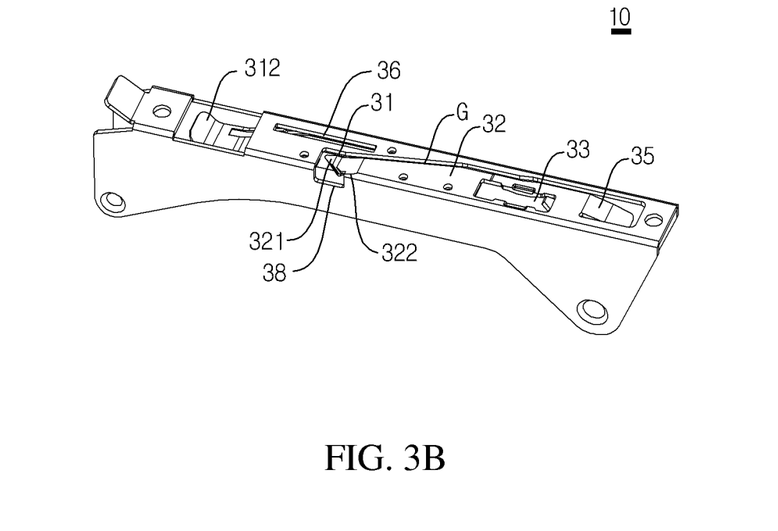
Figure 3C:
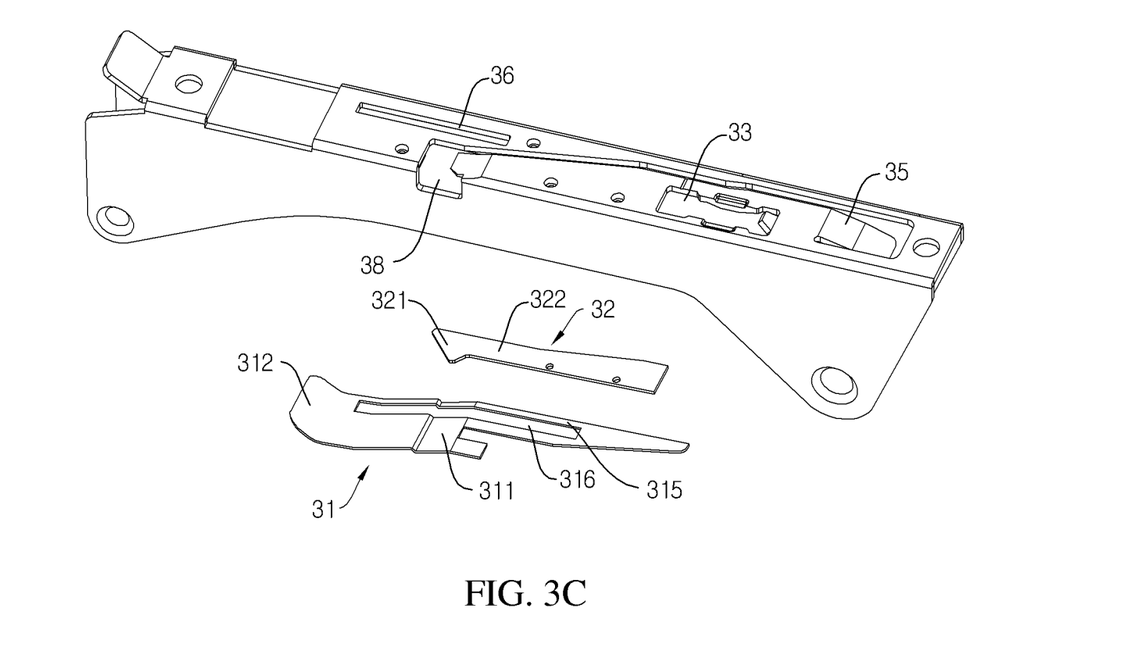

FIGS. 3A, 3B and 3C illustrate a device for automatically exposing parts that may be used for the apparatus for automatically supplying the carrier tape according to the embodiment of the present invention.

In this specification, the device for automatically exposing parts means an apparatus that has an equal or similar function to a tape guide.

Referring to FIG. 3A, a cover tape may be separated from a base tape by the device for automatically exposing parts, which may include a separation blade 321 that has different thicknesses and widths in a lengthwise direction and separates a cover tape from the base tape; and a guide that separates the cover tape, which starts being separated from the base tape by the separation blade 321, by a predetermined width and enables the cover table to be folded.

A carrier tape may be transferred by being closely adhered to a bottom surface, and once it arrives in the separation blade 321, a side of the cover tape starts being separated from the base tape. A side of the separation blade 321 may be sharp and narrow and an extension portion of the separation blade 321 may be wider and thick. The maximum width of the extension portion of the separation blade 321 may be narrower than that of the cover tape.

A separated width of the cover tape becomes wider when the carrier tape passes through the guide 39. The guide 39 may be wider in width in a direction in which the carrier tape advances, and may form a consistent space with respect to a facing separation unit 32 along a boundary surface B. The boundary surface B may be diagonal, and a step surface 327 may be formed in a lower surface of the guide 39 and extend along the boundary surface B. The separated cover tape is pushed by the step surface 327 while in transfer, and the separated surface of the cover tape overlaps the non-separated surface, and thus the overlapped cover tape in duplicate may be discharged through a discharging module. As the step surface 327 is formed in the lower side of the guide along the boundary surface B, the folding structure of the cover tape is simple and the cover tape may always be folded toward an outer side of an electronic part regardless of the size of the part.

Referring to FIGS. 3B and 3C, a device for automatically exposing parts 30 may include a frame in which a guide is formed to transfer a carrier tape; a base plate 31 which is coupled to a lower side of a ceiling surface of the frame; and a separation unit 32 which has a separation blade 321 having a step from at least a predetermined portion of the base plate 31.

The frame may include a pair of lateral walls which are arranged at a predetermined interval, a ceiling surface and an internal supporting structure. The frame may support other elements, or may perform a certain function relating to a transfer of a carrier tape during a process of transferring a carrier tape.

The base plate 31 may be attached to a lower side of the ceiling surface. The base plate 31 may be positioned in an upper side of the carrier tape or an upper side of a cover tape and may guide a transfer of the carrier tape. The base plate 31 may extend in a transfer direction of the carrier tape, and may have a width that varies in an extension direction. The base plate 31 may be separately manufactured from the ceiling surface, and may be attached to a lower plan of the ceiling surface.

The separation unit 32 may include a separation blade 321 which contacts a thickness surface of the carrier tape in a position facing a separation preparing area 311 of the base plate 31, and an extension guide 322 that extends from the separation blade 321 in a transfer direction of the carrier tape. The separation unit 32 may be shaped like a plate as a whole, and the separation blade 321 may be independently manufactured and may be coupled to, or integrally formed in, the extension guide 322.

An end portion of the separation blade 321 forms a step against a lower plan of the base plate 31, at least a part of the separation preparing area 311 or an end portion of the separation preparing area 311. The step is formed as the end portion of the separation blade 321 is lower than the lower plan of the base plate 31. The step may be determined by a thickness of the cover tape, may be equal to or a bit larger than the thickness of the cover tape, and may be set so that at least the end portion of the separation blade 321 is below the base plate 31 or the separation preparing area 311. According to the present invention, the arrangement of the base plate 31, the structure of the separation unit 32 and the step between the separation preparing area 311 in the base plate 31 and the separation blade 321 enables an automatic uncovering or automatic separation of the cover tape from the carrier tape.

The device for automatically exposing parts 30 may further include a part exposing window 33 that is formed in a ceiling surface F2 and enables a pickup of an electronic part, a lower pressure plate 35 that applies a supporting pressure downward during a process of discharging a carrier tape accommodating an electronic part therein, and a guiding pressure surface 312 that forms a part of the base plate 31 or is independently formed. An extension gap G may be formed in the ceiling surface to fold and transfer the cover tape that has been separated from the carrier tape.

Impurities may be caused from a separation of the cover tape from the carrier tape or from an insertion of the separation blade 321 between the cover tape and the base tape. In order to discharge the impurities, a discharging hole 38 may be formed in a lateral surface of the separation blade 321 toward an edgy portion from which the cover tape is separated. The discharging hole 38 may be formed by various methods, and the present invention is not limited to the embodiment provided herein.

As shown in FIG. 3C, the base plate 31 may include the separation preparing area 311 that is shaped like a plate as a whole and prepares for a separation of the cover tape, the guide pressure surface 312 that is formed in a rear side of the separation preparing area 311 and has an end portion facing upward, and applies a proper pressure to the carrier tape that is transferred from below, and the guide area 315 that is formed in front of the separation preparing area 311 and guides a separated cover tape to be pushed and folded in a direction. An avoidance groove 316 may be formed in the base plate 31 corresponding to an avoidance area 36. In the base plate 31, opposite sides of the separation preparing area 311 may have different widths, and the guide area 315 may extend in different widths.

The separation unit 32 may include the separation blade 321 and an extension guide 322 that extends in a transfer direction of the carrier tape, and the extension guide 322 may extend in different widths.

According to the present invention, an end portion of the separation preparing area 311 faces the separation blade 321, and an end portion of the separation blade 321 is below the end portion of the separation preparing area 311. An extension gap G may be formed between the guide area 315 and the extension guide 322 or between the ceiling surface to which the guide area 315 is coupled and the extension guide 322. As will be described below, the extension gap G provides a space in which a separated cover tape is pushed to an edge to be folded.

As described above, the apparatus for automatically supplying the carrier tape according to the present invention does not require a manual separation of a cover tape to thereby improve work efficiency. Also, the apparatus for automatically supplying a carrier tape according to the present invention enables an adjustment of a degree of folding a cover tape depending on the size of a part and enables a change in a separation direction and separation position of a cover tape to thereby prevent a part from getting out of a predetermined position. Further, the apparatus for automatically supplying a carrier tape according to the present invention enables saving of mounting time for a carrier tape and reduction of time for connecting and replacing a carrier tape for supplying a new electronic part. A method for automatically supplying a carrier tape according to the present invention enables a sensing of an existence or non-existence of a minute part accommodated in a carrier tape to thereby improve accuracy of work Although a few exemplary embodiments have been shown and described, it will be appreciated by those skilled in the art that changes may be made in these exemplary embodiments without departing from the principles and spirit of the invention, the range of which is defined in the appended claims and their equivalents.

INDUSTRIAL APPLICABILITY

An apparatus for automatically supplying a carrier tape according to the present invention does not require a manual separation of a cover tape to thereby improve work efficiency. Also, the apparatus for automatically supplying a carrier tape according to the present invention enables an adjustment of a degree of folding a cover tape depending on the size of a part and enables a change in a separation direction and separation position of a cover tape to thereby prevent a part from getting out of a predetermined position. Further, the apparatus for automatically supplying a carrier tape according to the present invention enables saving of mounting time for a carrier tape and reduction of time for connecting and replacing a carrier tape for supplying a new electronic part. A method for automatically supplying a carrier tape according to the present invention enables a sensing of an existence or non-existence of a minute part accommodated in a carrier tape to thereby improve accuracy of work.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A module for supplying a carrier tape comprising:
a first cushion unit for closely adhering a carrier tape that has been injected from an injection opening to a transfer path;
a second cushion unit which is adjacent to the first cushion unit and transfers a carrier tape from the first cushion unit; and
a tape stopper for determining whether to transfer a carrier tape through the second cushion unit depending on the number of the carrier tape, wherein the tape stopper is arranged so that the arrangement may be changed with respect to the transfer path according to a transfer of the carrier tape.

2. The module according to claim 1, wherein the tape stopper and the second cushion unit are connected by a position adjusting connector, which rotates according to a transfer of a carrier tape.

\* \* \* \* \*